(12) United States Patent
Watanabe

(10) Patent No.: US 7,982,299 B2
(45) Date of Patent: Jul. 19, 2011

(54) POWER SEMICONDUCTOR MODULE

(75) Inventor: Naotake Watanabe, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 288 days.

(21) Appl. No.: 12/190,941

(22) Filed: Aug. 13, 2008

(65) Prior Publication Data
US 2009/0045490 A1 Feb. 19, 2009

(30) Foreign Application Priority Data
Aug. 16, 2007 (JP) .................. 2007-212307

(51) Int. Cl.
*H01L 23/52* (2006.01)
(52) U.S. Cl. ........ 257/690; 257/712; 257/717; 257/722; 257/E23.079; 257/E23.08; 361/717
(58) Field of Classification Search .................. 257/690, 257/712, 717, 722, E23.079, E23.08; 361/717
See application file for complete search history.

(56) References Cited

U.S. PATENT DOCUMENTS
2006/0164813 A1* 7/2006 Yoshioka et al. ............. 361/717

FOREIGN PATENT DOCUMENTS
| | | |
|---|---|---|
| CN | 1783471 A | 6/2006 |
| JP | 2002-164485 | 6/2002 |
| JP | 2003-10064 | 1/2003 |

* cited by examiner

*Primary Examiner* — Andy Huynh
(74) *Attorney, Agent, or Firm* — Oblon, Spivak, McClelland, Maier & Neustadt, L.L.P.

(57) ABSTRACT

Included are a semiconductor package, a first bus bar, a second bus bar and a soldering control unit. The semiconductor package includes a power semiconductor element, a first electrode plate and a second electrode plate. The first bus bar is a conductive member which is soldered onto the main surface of the first electrode plate through a first solder member. The second bus bar is a conductive member which is soldered onto the main surface of the second electrode plate through a second solder member. The soldering control unit is provided on each of the main surface of the first bus bar to which the first electrode plate is soldered and the main surface of the second bus bar to which the second electrode plate is soldered, and controls the solder joint thickness.

5 Claims, 8 Drawing Sheets

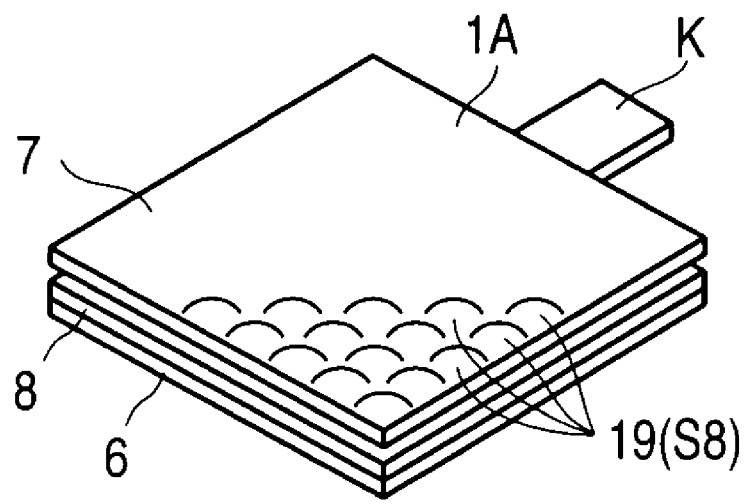
F I G. 12A
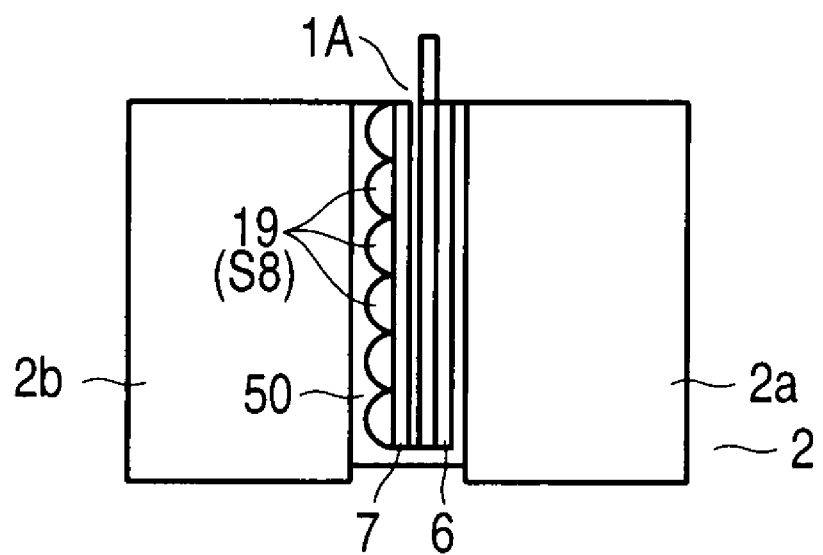
F I G. 12B

POWER SEMICONDUCTOR MODULE

CROSS-REFERENCE TO RELATED APPLICATIONS

This application is based upon and claims the benefit of priority from prior Japanese Patent Application No. 2007-212307, filed Aug. 16, 2007, the entire contents of which are incorporated herein by reference.

BACKGROUND OF THE INVENTION

1. Field of the Invention

The present invention relates to a power semiconductor module including bus bars that are conductive members and solder-joined to both sides of a sheet-shaped semiconductor device including a power semiconductor element, such as an IGBT.

2. Description of the Related Art

Widely used power semiconductor elements include IGBT (Insulated Gate Bipolar Transistor), IEGT (Injection Enhanced Transistor), and MOS-FET (Metal Oxide Semiconductor Field Effect Transistor). The power semiconductor element is formed in a sheet-like shape. The power semiconductor element includes a first power terminal and a control terminal on its main surface, and a second power terminal on the back surface thereof. When the power semiconductor element is an IBGT element, the first power terminal is an emitter electrode, the second power terminal is a collector electrode, and the control terminal is a gate electrode.

Jpn. Pat. Appln. KOKAI Publication No. 2003-10064 or 2002-164485 discloses techniques for forming the semiconductor device using such a power semiconductor element mounted on the substrate. According to such techniques, the second power terminal of the semiconductor element is solder-joined to the electrode on the surface side of the substrate, and the first power terminal and control terminal of the semiconductor element are connected to the electrode on the substrate surface using wire bonding with aluminum wire.

In the wire boding, one piece of wire is bonded at a time, thus requiring a lot of bonding time. In the wire bonding, the wire has a loop-like form, thus has a long wire length, resulting in an increased wiring inductance. Further, the technical problems of the wire are that it is sensitive to oscillation, and that there is high possibility of cutting or proximity short circuit.

Thus, provided are some methods: for bonding an aluminum thin sheet to the first power terminal of the semiconductor element; and for solder-joining the first power terminal of the semiconductor element with a flat plate or the lead so as to extract it as an electrode. Particularly, the first power terminal of the semiconductor element is formed of a material usable for solder joints. The method for solder joining the terminal with the flat plate or the lead has come to public attention. The lead-out wire from the control terminal is connected to the terminal by wire bonding.

In the semiconductor module including a plurality of semiconductor devices (hereinafter referred to as "semiconductor packages"), the plurality of semiconductor packages are arranged in line on a base substrate as a heat dissipation plate. Then, the back surface of the substrate of the semiconductor package is joined onto the base substrate. Such a semiconductor module is mounted on a power controller, such as an inverter, converter, etc.

However, in the above-described semiconductor module, only one surface of each semiconductor package is in contact with the base substrate. Thus, sufficient heat dissipation cannot be attained. The substrate back surface of each semiconductor package is joined onto the base substrate, resulting in a large installation area of the semiconductor package with respect to the base substrate and increasing the size of the semiconductor module.

To overcome the above disadvantages, the semiconductor packages are arranged in line, bus bars as conductive members are installed on and sandwiched between the main surface and back surface of the semiconductor package, and these elements are provided on the base substrate.

To be more specific, a solder member is provided for coating at least one of the main surface and back surface of the semiconductor package and the surface of the bus bar where the semiconductor package is provided. The sheet-shaped semiconductor package is set up so as to be in a vertical posture, and the side surfaces of the bus bars are aligned to the main and back surfaces so as to temporarily be held, and the package is contained in a heating furnace and heated therein. The solder member melts so as to solder-join the semiconductor package to the bus bar.

A problem still remains when the semiconductor package is solder-joined to the bus bar through the solder member. That is, when the sheet-shaped semiconductor package is set up in a vertical posture, the main surface and back surface of this semiconductor package and the side surfaces of the solder-joined bus bars will be vertical planes. A part of the solder member which has melted by being heated in the heating furnace flows out through the lower end of the semiconductor package to the lower end of the bus bar, under the influence of gravity. That is, a part of the solder member which has melted by being heated in the heating furnace is likely to spread out to the lower end of the semiconductor package.

In order to prevent the flowing out of the solder, it is considered to lower the amount of solder member. However, in this case, air bubbles are likely to be formed in a solder layer formed between the semiconductor package and the bus bar, thus not attaining a secure and highly reliable solder joint.

Accordingly, when the semiconductor package is set up in a vertical posture so as to be solder-joined to the bus bar, it is difficult to attain an optimum joint thickness of the solder between the semiconductor package and the bus bar, thus resulting in low reliability of the solder joint structure.

BRIEF SUMMARY OF THE INVENTION

In order to achieve the above-described object, there is provided a power semiconductor module comprising: a semiconductor device which includes a power semiconductor element, a first electrode plate provided on one surface of the power semiconductor element, a second electrode plate provided on the other surface of the power semiconductor element, and an insulating substrate provided between the power semiconductor element and the first electrode plate; a first bus bar which is a conductive member soldered to a main surface of the first electrode plate included in the semiconductor device, through a first solder member; a second bus bar which is a conductive member soldered to a main surface of the second electrode plate included in the semiconductor device, through a second solder member; and soldering control means which is provided on each of a main surface of the first bus bar to which the first electrode plate is soldered and a main surface of the second bus bar to which the second electrode plate is soldered, and which controls a solder joint thickness of each of the first solder member and the second solder member.

In order to achieve the above object, moreover, a power semiconductor module comprising: a semiconductor device which includes a power semiconductor element, a first electrode plate which is provided on one surface of the power semiconductor element, a second electrode plate which is provided on the other surface of the power semiconductor element, and an insulating substrate which is provided between the power semiconductor element and the first electrode plate, and which includes a protruding part a part of which protrudes outward beyond an outer edge of each of the first electrode plate and the second electrode plate and includes also an external connection terminal for connecting to a control electrode of the power semiconductor element at the protruding part; a first bus bar whose edge is aligned with the outer edge of a main surface of the first electrode plate included in the semiconductor device, and which is a conductive member soldered to the main surface of the first electrode plate through a first solder member; a second bus bar whose edge is aligned with the outer edge of a main surface of the second electrode plate included in the semiconductor device, and which is a conductive member soldered to the main surface of the second electrode plate through a second solder member; and soldering control means which is provided in the semiconductor device and controls a solder joint thickness of each of the first solder member and the second solder member.

In order to achieve the above object, moreover, a power semiconductor module comprising: a semiconductor device which includes a power semiconductor element a first electrode plate which is provided on one surface of the power semiconductor element, a second electrode plate which is provided on the other surface of the power semiconductor element, and an insulating substrate which is provided between the power semiconductor element and the first electrode plate; a first bus bar which is a conductive member soldered onto a main surface of the first electrode plate included in the semiconductor device through a first solder member; a second bus bar which is a conductive member soldered onto a main surface of the second electrode plate included in the semiconductor device through a second solder member; and a metal ball which is mixed in each of the first solder member and the second solder member and has the same diameter as a solder joint thickness and a melting point higher than a melting point of the first solder member and the second solder member.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 12A is a perspective view of a semiconductor package, in the eighth embodiment according to the soldering control unit;

FIG. 12B is a side view for explaining the soldering of bus bars to the semiconductor package, in the eighth embodiment according to the soldering control unit;

DETAILED DESCRIPTION OF THE INVENTION

Embodiments of the present invention will now be described with reference to the drawings.

Figure 1A:
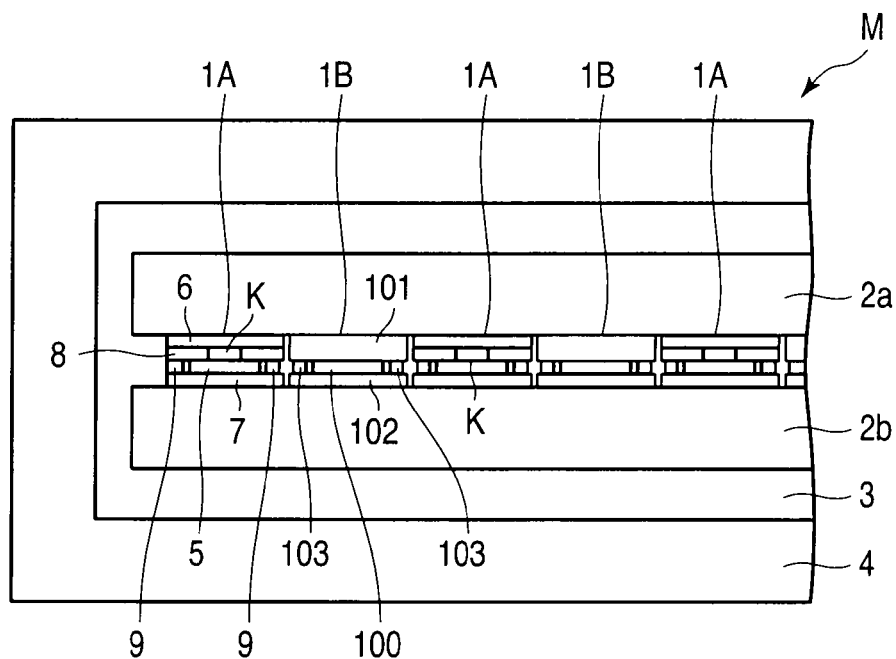
FIG. 1A is a plane view of a part of a power semiconductor module according to an embodiment of the present invention.
Figure 1B:
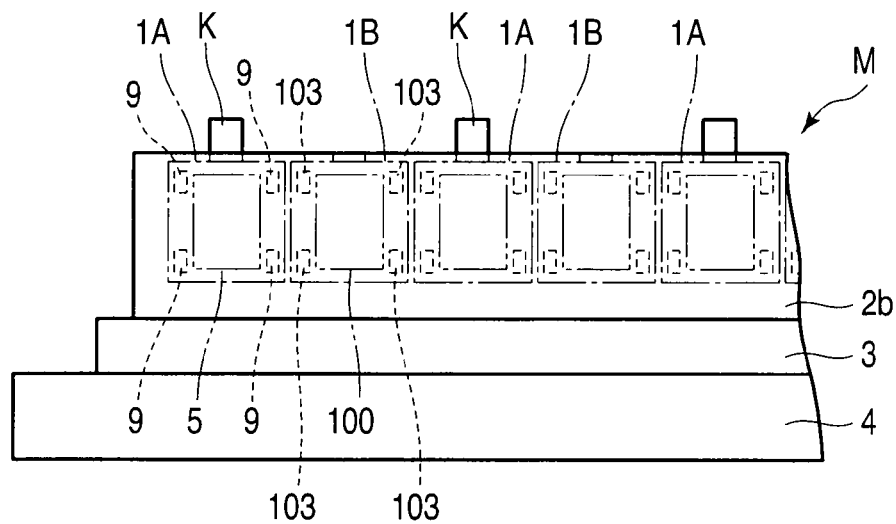
FIG. 1B is a front view of a part of the power semiconductor module according to the embodiment of the present invention.

FIG. 1A is a plane view of a partially omitted power semiconductor module M, while FIG. 1B is a front view of the partially omitted power semiconductor module M.

This power semiconductor module M includes a plurality of power semiconductor devices (hereinafter referred to as "power semiconductor packages") 1A and a plurality of rectifying semiconductor devices (hereinafter referred to as "rectifying semiconductor packages") 1B. The power semiconductor module M includes a first bus bar 2a and a second bus bar 2b, an insulator 3 and a heat dissipation plate 4. The first and second bus bars 2a and 2b are so provided that the semiconductor packages 1A and 1B are sandwiched and held therebetween, and the first and second bus bars 2a and 2b are electrically connected conductive members. The insulator 3 is formed from an insulating sheet, an insulating plate, etc. for supporting the first and second bus bars 2a and 2b. The heat dissipation plate 4 is overlapped over this insulator 3.

The power semiconductor packages 1A and the rectifying semiconductor packages 1B are arranged in line alternately in a longitudinal direction of the first and second bus bars 2a and 2b. As will be described later, the power semiconductor packages 1A and the rectifying semiconductor packages 1B are solder-joined through a first solder member on one side surface of the first bus bar 2a, and are solder-joined through a second solder member on one side surface of the second bus bar 2b.

Each of the power semiconductor packages 1A is formed from a power semiconductor element 5 such as an IGBT element, a first electrode plate 6, a second electrode plate 7, and an insulating substrate 8, which are laminated one on top of the other. The first electrode plate 6 is provided on the main surface of the power semiconductor element 5. The second electrode plate 7 is provided on the back surface of the power semiconductor element 5, i.e. on the opposite side of the main surface. The insulating substrate 8 is provided between the power semiconductor element 5 and the first electrode plate 6.

The power semiconductor element 5 is an IGBT element on which an IGBT is mounted. The power semiconductor element 5 is formed in the shape of a plate like piece, so as to have the outer edge that is inner with respect to the outer edge of each of the first electrode plate 6, the second electrode plate 7 and the insulating substrate 8. On the main surface of the power semiconductor element 5, a first power terminal as an emitter electrode and a control terminal as a gate electrode are provided. Further, a second power terminal as a collector electrode is provided on the back surface, i.e., on the opposite surface of the main surface.

The insulating substrate 8 includes a protruding part K which protrudes beyond the outer edge of each of the power semiconductor element 5, the first and second electrode plates 6 and 7. This protruding part K includes an external connection terminal so as to be connected to the control terminal of the semiconductor element 5 through the wiring.

That is, the protruding part K protrudes upwards from the outer edges of the first and second electrode plates 6 and 7 and the insulating substrate 8 and from the upper edge of the first and second bus bars 2a and 2b, in a state in which the semiconductor packages 1A are sandwiched and solder-joined between the first and second bus bars 2a and 2b. Thus, the control wiring can be protruded outside the package without using wire bonding.

Spacers 9 are provided between the second electrode plate 7 and the insulating substrate 8, so as to keep a predetermined distance between the second electrode plate 7 and the insulating substrate 8. For example, four spacers 9 are provided therebetween, and positioned on the respective four corners of the package 1A in positions outer with respect to the outer edge of the power semiconductor element 5.

Each of the power semiconductor packages 1A includes the spacers 9, thereby keeping a predetermined distance between the second electrode plate 7 and the insulating substrate 8 and securely preventing damage of the power semiconductor element 5 due to external force. As a result, the component reliability of the semiconductor package 1A can be improved.

Each of the rectifying semiconductor packages 1B includes a rectifying semiconductor element 100 (such as a diode element), a first electrode plate 101 and a second electrode plate 102 which are electrically connected and between which the rectifying semiconductor element 100 is sandwiched and held. Each of the rectifying semiconductor packages 1B includes spacers 103 for keeping a predetermined distance between the axes of the first and second electrode plates 101 and 102, and is formed in a sheet-like shape. The spacers 103 are positioned on the respective four corners of the first electrode plate 101 in positions outer with respect to the outer edge of the rectifying semiconductor element 100.

The first and second bus bars 2a and 2b are formed from a very highly conductive member, such as a copper member, and are each formed in a square pillar shape. The first and second bus bars 2a and 2b respectively function as electrode members commonly for the power semiconductor packages 1A and the rectifying semiconductor packages 1B. The first and second bus bars 2a and 2b have thermal conductivity, and function also as heat dissipaters.

In this case, the first bus bar 2a is solder-joined to the first electrode plate 6 included in the power semiconductor package 1A through the first solder member included therein so as to be electrically connected thereto, and functions as an emitter electrode block. The second bus bar 2b is solder-joined to the second electrode plate 7 included in the power semiconductor package 1A through the second solder member so as to be electrically connected thereto, and functions as a collector electrode block.

A combination of a plurality of such power semiconductor modules M realizes, for example, industrial inverters, inverters for trains/electric automobiles, or power controllers, such as a converter, etc.

Descriptions will now be made on the solder-joint between the semiconductor packages and the bus bars.

Figure 2A:
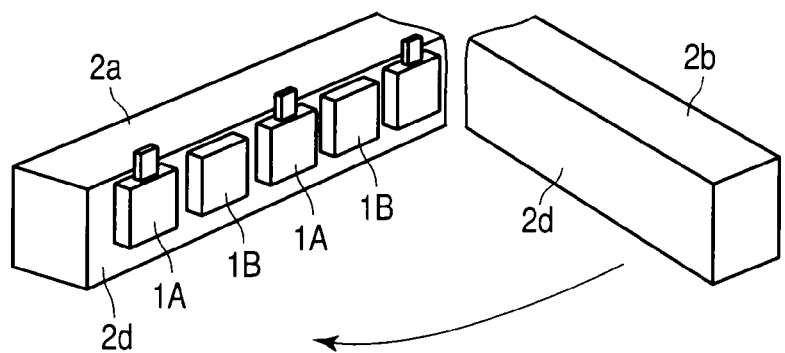
FIG. 2A is a perspective view for explaining the soldering of bus bars to a semiconductor package according to the embodiment.
Figure 2B:
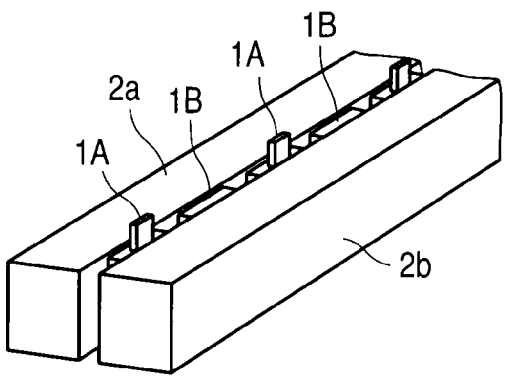
FIG. 2B is a perspective view for explaining the soldering of the bus bars to the semiconductor package according to the embodiment.

FIG. 2A is a perspective view of a state in which the power semiconductor packages 1A and the rectifying semiconductor packages 1B are soldered to the first bus bar 2a, and FIG. 2B is a perspective view of a state in which both of the semiconductor packages 1A and 1B are soldered through and held by the first and second bus bars 2a and 2b.

As described above, the power semiconductor packages 1A and the rectifying semiconductor packages 1B are arranged on the same straight line alternately in the longitudinal direction of the first and second bus bars 2a and 2b, and are soldered onto vertical plane surfaces 2d of the first and second bus bars 2a and 2d. That is, each of the semiconductor packages 1A and 1B with a sheet-like shape is so formed that its main surface and the back surface facing the main surface are set up so as to be in a vertical posture. Further, the main surface is solder-joined to the vertical plane surface 2d of the first bus bar 2a through the first solder member, while the back surface is soldered to the vertical plane surface 2d of the second bus bar 2b through the second solder member.

In fact, the first electrode plate 6 included in the power semiconductor package 1A and the second electrode plate 101 included in the rectifying semiconductor package 1B are soldered to the vertical plane surface 2d of the first bus bar 2a through the first solder member. Further, the second electrode plate 7 included in the power semiconductor package 1A and the second electrode plate 102 included in the rectifying semiconductor package 1B are soldered to the vertical plane surface 2d surface of the second bus bar 2b.

Thus, each of the sheet-like shaped semiconductor packages 1A and 1B is set up in the vertical posture while its main surface is set up, is sandwiched and held between the first bus bar 2a and the second bus bar 2b, and is solder-joined through the first and second solder members, thereby forming the power semiconductor module M.

The semiconductor packages 1A and 1B and the first and second bus bars 1a and 2b are solder-joined at their vertical plane surfaces. Thus, in the present invention, either one of the first and second bus bars 2a and 2b, the semiconductor packages 1A, first and second solder members 50 includes a soldering control unit (soldering control means) for optimizing the thickness of the solder joint.

Descriptions will now be made on the soldering for the power semiconductor packages 1A. The soldering for the rectifying semiconductor packages 1B is implemented in the same manner. Thus, the soldering for the rectifying semiconductor packages 1B will not be described. The first and second bus bars 2a and 2b are processed in the same manner. Only one of the bus bars is illustrated in the drawings, and is shown as "bus bar 2".

Figure 3:
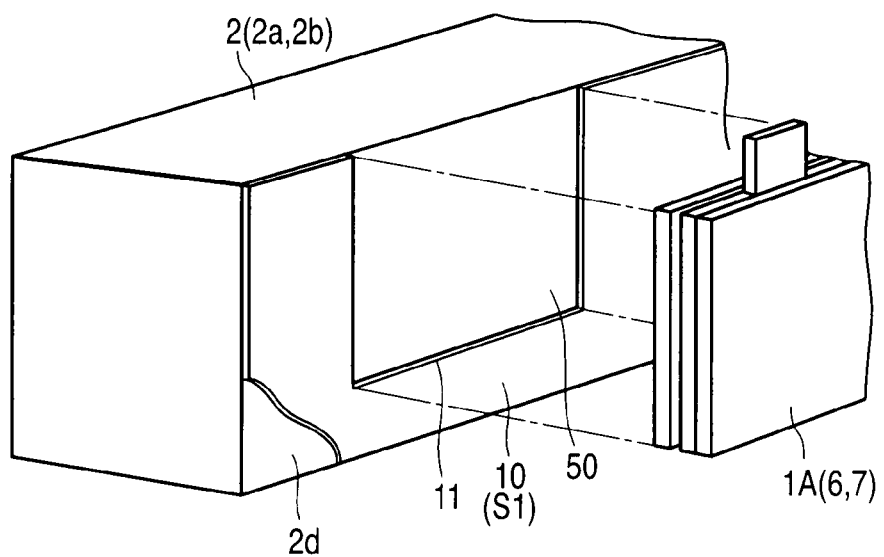
FIG. 3 is a perspective view for explaining the soldering of the bus bar to the semiconductor package in the first embodiment according to a soldering control unit.

FIG. 3 is a partial perspective view of the bus bar 2 (i.e. each of the first bus bar 2a and the second bus bar 2b including the soldering control unit (soldering control means) described in the first embodiment).

The vertical plane surface 2d of the first bus bar 2a and the vertical plane surface 2d of the second bus bar 2b are covered by a solder resist film 10 as a soldering control unit S1 shown in FIG. 3. This solder resist film 10 has a thickness of 20 to 30 mm, and is formed by printing. There is no limitation with respect to the material or type of the solder resist film 10. The same applies herein below.

The solder resist film 10 includes a plurality of fitting parts 11 each having a rectangular shaped opening, at a predetermined interval (FIG. 3 shows only one of them). In other words, the solder resist film 10 entirely covers the vertical plane surface 2d of the bus bar 2, except the fitting parts 11.

The fitting part 11 provided in the first bus bar 2a is formed to have the same surface size as the main surface of the first electrode plate 6 of the semiconductor package 1A, while the fitting part 11 provided in the second bus bar 2b is formed to have the same surface size as the main surface of the second electrode plate 7 of the semiconductor package 1A.

The fitting part 11 provided in the first bus bar 2a is coated with the first solder member 50, while the fitting part 11 provided in the second bus bar 2b is coated with the second solder member 50.

The first and second solder members 50 may be of any materials, such as an Sn—Pb eutectic solder, a lead-free solder, a Pb-rich high-temperature solder, and the like. In addition, the solder may be a sheet which has been cut according to the shape of the fitting part 11, solder paste on which printing has been performed in accordance with a printing method, or a solder which has been formed in a plated film or by vapor deposition. The same applies herein below.

In the soldering process, the first electrode plate 6 of the semiconductor package 1A is aligned with the fitting part 11 of the solder resist film 10 covering the vertical plane surface 2d of the first bus bar 2a, so as to be temporarily held therebetween. Further, the second electrode plate 7 of the semiconductor package 1A is aligned with the fitting part 11 of the solder resist film 10 covering the vertical plane surface 2d of the second bus bar 2b, so as to be temporarily held therebetween.

In this state, the semiconductor package 1A and the first and second bus bars 2a and 2b are contained in a heating furnace so as to be heated therein. After a predetermined time period has elapsed, the first solder member 50 melts, resulting in that the first electrode plate 6 and the first bus bar 2a are solder-joined. At the same time, the second solder member 50 melts, resulting in that the second electrode plate 7 and the second bus bar 2b are solder-joined.

The melted solder member 50 tends to remain on the lower end of the semiconductor package 1A and the fitting part 11, under the influence of gravity. However, even if the melted solder member 50 spreads out so as to wet a wide range beyond the fitting part 11, the solder member is securely prevented from spreading out or flowing out, because the solder resist film 10 surrounds the periphery of the fitting part 11.

Accordingly, the fitting part 11 that is an opening having the same size as the main surface of the first electrode plate 6 is provided in the solder resist film 10 covering the vertical plane surface 2d of the first bus bar 2a, as the soldering control unit S1. In addition, the fitting part 11 that is an opening having the same size as the main surface of the second electrode plate 7 is provided in the solder resist film 10 covering the vertical plane surface 2d of the second bus bar 2b, as the soldering control unit S1. A solder pool is formed only in an area required to be soldered by this soldering control unit S1, resulting in an optimum solder joint thickness (50 to 100 µm) for the soldering of the semiconductor package 1A to the first and second bus bars 2a and 2b, and also improved reliability of the solder joint.

Unlike the above embodiment, if the size of the fitting part 11 of the solder resist film 10 included in the soldering control unit S1 is not the same as that of the main surface of the first and second electrode plates 6 and 7 of the semiconductor package 1A, and if its size is smaller than that of the first and second electrode plates 6 and 7, a sufficient solder joint area cannot be provided. In this case, there is the possibility of damaging the reliability of the soldering.

Figure 4A:
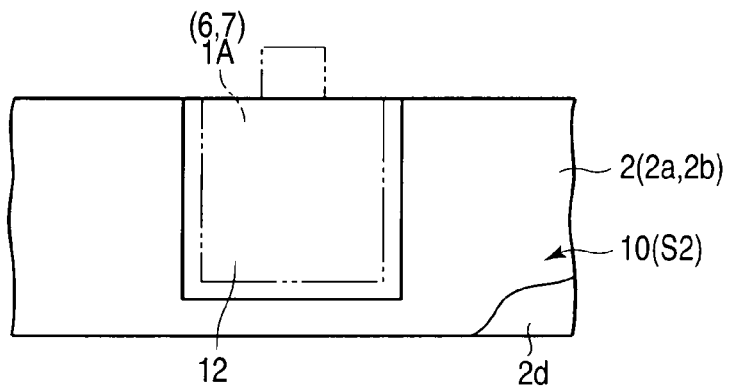
FIG. 4A is a partial front view of a bus bar in the second embodiment according to a soldering control unit.
Figure 4B:
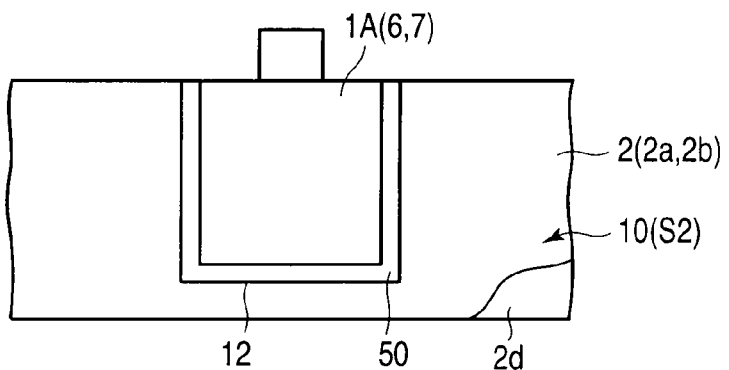
FIG. 4B is a partial front view for explaining the soldering of the bus bar to a semiconductor package in the second embodiment according to the soldering control unit.

FIG. 4A is a partial front view of the bus bar 2 including the first and second bus bars 2a and 2b which have the soldering control unit (soldering control means) S2 of the second embodiment, and FIG. 4B is a partial front view of the bus bar 2 to which the semiconductor package 1A is soldered.

As shown in FIG. 4A, the vertical plane surface 2d of the first bus bar 2a and the vertical plane surface 2d of the second bus bar 2b are covered by the solder resist film 10 as the soldering control unit S2, shown in FIGS. 4A and 4B.

A plurality of fitting parts 12 each including an opening having a rectangular shape are provided in the solder resist film 10 at a predetermined interval (FIGS. 4A and 4B show only one of them). In other words, the solder resist film 10 entirely covers the vertical plane surface 2d of the bus bar 2, except the fitting part 12.

The fitting part 12 provided in the first bus bar 2a is formed to have a larger size than the size of the main surface of the first electrode plate 6 of the semiconductor package 1A, as shown by a long dashed double-short dashed line in FIG. 4A. The fitting part 12 provided in the second bus bar 2b is formed to have a larger size than the size of the main surface of the second electrode plate 7 of the semiconductor package 1A, as shown by a long dashed double-short dashed line in FIG. 4A.

Specifically, at the time the solder joint is made, the position of the upper edge of the first electrode plate 6 is aligned with the position of the upper edge of the first bus bar 2a, and the position of the upper edge of the second electrode plate 7 is aligned with the position of the upper edge of the second bus bar 2b. The right and left width sizes of the fitting part 12 are larger than the right and left width sizes of each of the electrode plates 6 and 7. In addition, the lower edge of the fitting part 12 is lower than the lower edge of each of the electrode plates 6 and 7.

As shown in FIG. 4B, the fitting part 12 provided in the solder resist film 10 of the first bus bar 2a is coated with the first solder member 50. The fitting part 12 provided in the solder resist film 10 of the second bus bar 2b is coated with the second solder member 50.

The first electrode plate 6 of the semiconductor package 1A is aligned with the fitting part 12 of the solder resist film 10 in the first bus bar 2a, so as to be temporarily held therebetween. At this time, the position of the upper edge of the first electrode plate 6 is aligned with the position of the upper edge of the first bus bar 2a. However, the right and left width sizes of the fitting part 12 are larger than the right and left width sizes of the first electrode plate 6, and the lower edge of the fitting part 12 is lower than the lower edge of the first electrode plate 6.

Further, the second electrode plate 7 included in the back surface facing the main surface of the semiconductor package 1A is aligned with the fitting part 12 of the solder resist film 10 in the second bus bar 2b, so as to be temporarily held therebetween. At this time, the position of the upper edge of the second electrode plate 7 is aligned with the position of the upper edge of the second bus bar 2b. The right and left width sizes of the fitting part 12 are larger than the right and left width sizes of the second electrode plate 7, and the lower edge of the fitting part 12 is lower than the lower edge of the second electrode plate 7.

The semiconductor package 1A and the first and second bus bars 2a and 2b are contained in a heating furnace so as to be heated therein. After a predetermined period of time has elapsed, the first solder member 50 melts. Then, the first electrode plate 6 and the first bus bar 2a are solder-joined. At the same time, the second solder member 50 melts as well, and the second electrode plate 7 and the second bus bar 2b are solder-joined.

Spaces are formed between the right and left side edges and the lower edge of the first and second electrode plates 6 and 7 and the right and left side edges and the lower edge of the fitting part 12. Thus, the heated first and second solder members 50 melt so that the entire surface of the first electrode plate 6 and the first bus bar 2a are securely solder-joined, and the entire surface of the second electrode plate 7 and the second bus bar 2b are securely solder-joined, thereafter the melted solder member 50 exudes into the space formed between the edges of the electrode plates 6 and 7 and the fitting part 12.

The melted solder member 50 tends to remain in the space formed between the lower edges of the electrode plates 6 and 7 and the lower edge of the fitting part 12 under the influence of gravity. However, even if the melted solder member 50 spreads out beyond the fitting part 12, it is prevented from spreading out or flowing out by the solder resist film 10.

Accordingly, the fitting part 12, which is an opening having a larger size than the size of the main surface of the first electrode plate 6, is provided in the solder resist film 10 covering the vertical plane surface 2d of the first bus bar 2a, as the soldering control unit S2, while the fitting part 12, which is an opening having a size larger than the size of the main surface of the second electrode plate 7, is provided in the solder resist film 10 covering the vertical plane surface 2d of the second bus bar 2b. As a result, the solder pool is formed only in an area required to be soldered, resulting in an optimum solder joint thickness (50 to 100 mm) for the soldering of the semiconductor package 1A to the first and second bus bars 2a and 2b and also improved reliability of the solder joint.

Figure 5A:
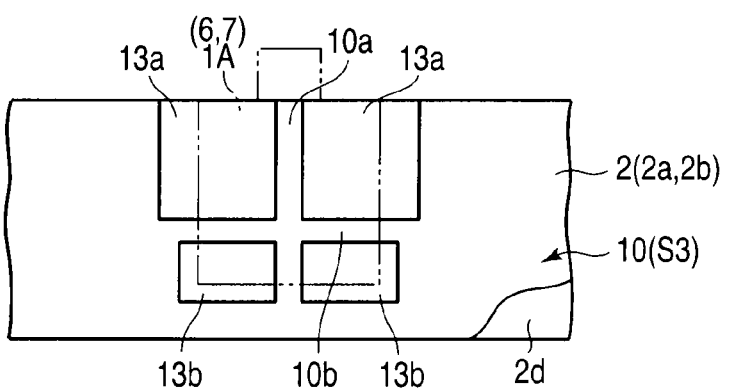
FIG. 5A is a partial front view of a bus bar in the third embodiment according to a soldering control unit.
Figure 5B:
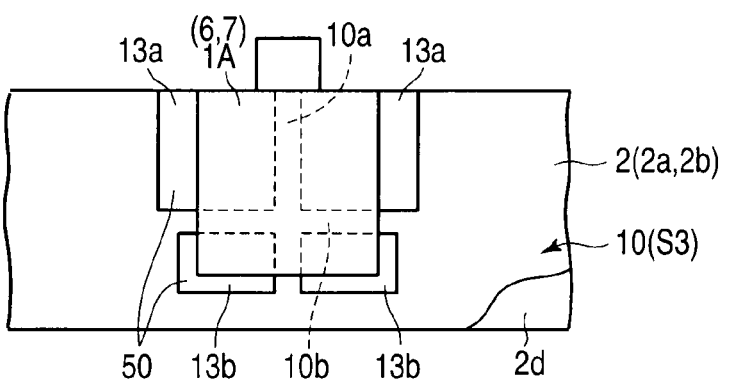
FIG. 5B is a partial front view for explaining the soldering of the bus bar to a semiconductor package in the third embodiment according to the soldering control unit.

FIG. 5A is a partial front view of the bus bar 2 including the first bus bar 2a and the second bus bar 2b each having a soldering control unit (soldering control means) S3 of the third embodiment, while FIG. 5B is a partial front view showing the semiconductor package 1A soldered to the bus bar 2.

As shown in FIG. 5A, the vertical plane surface 2d of the first bus bar 2a and the vertical plane surface 2d of the second bus bar 2b are covered by the solder resist film 10 that is the soldering control unit S3, shown in FIGS. 5A and 5B.

A plurality of fitting parts 13a and 13b are provided in the solder resist film 10 of the first bus bar 2a at a predetermined interval. In other words, the solder resist film 10 entirely covers the vertical plane surface 2d of the first bus bar 2a, except the fitting parts 13a and 13b. FIGS. 5A and 5B show only one pair of the fitting parts 13a and 13b.

The plurality of fitting parts 13a and 13b are provided in the solder resist film 10 of the second bus bar 2b at a predetermined interval. In other words, the solder resist film 10 entirely covers the vertical plane surface 2d of the second bus bar 2b, except the fitting parts 13a and 13b. FIGS. 5A and 5B show only one pair of the fitting parts 13a and 13b.

In both of the bus bars 2a and 2b, the fitting parts 13a are provided on approximately half of the vertical plane surface 2d in an upward/downward direction from the upper edge thereof, and two of the fitting parts are arranged in parallel right and left. The fitting part 13b is provided at a separate position on the lower side of the fitting part 13a, and this lower edge is provided at a predetermined space away from the lower end of the vertical plane surface 2d. Two of the fitting parts 13b are arranged in parallel right and left.

Hereinafter, the upper side fitting part 13a is referred to as a "first fitting part", while the lower side fitting part 13b is referred to as a "second fitting part". The space between the first fitting parts 13a is equal to the space between the second fitting parts 13b, and the equal space is provided between the first fitting parts 13a and the second fitting parts 13b.

That is, the approximately cross-shaped solder resist film 10 with an even width intervenes between the first fitting parts 13a, and between the second fitting parts 13b, and also between the first fitting parts 13a and the second fitting parts 13b.

A part of the solder resist film 10, which is formed vertically between the first fitting parts 13a and also between the second fitting parts 13b, is called a "vertical partition part" 10a. A part of the solder resist film 10, which is formed horizontally between the lower edge of the first fitting part 13a and the upper edge of the second fitting part 13b, is called a "horizontal partition part" 10b.

Particularly, the horizontal partition part 10b horizontally partitions the first fitting part 13a and the second fitting part 13b into two stages. That is, the solder resist film 10 covers the main surface of the first bus bar 2a onto which the first electrode plate 6 is soldered, partitions a fitting area (the first and second fitting parts 13a and 13b) having a larger size than the size of the main surface of the first electrode plate 6 in a position where the first electrode plate 6 is soldered, and has a partition area (the horizontal partition part 10b) for partitioning the fitting area into a plurality of areas.

Further, the solder resist film 10 covers the main surface of the second bus bar 2b onto which the second electrode plate 7 is soldered, partitions a fitting area (the first and second fitting parts 13a and 13b) having a size larger than the size of the main surface of the second electrode plate 7 in a position where the second electrode plate 7 is soldered, and has a partition area (the horizontal partition part 10b) for partitioning the fitting area into a plurality of areas.

As shown in FIG. 5B, the first solder member 50 is provided for coating the first fitting part 13a and the second fitting part 13b provided in the solder resist film 10 of the first bus bar 2a. The second solder member 50 is provided for coating the first fitting part 13a and the second fitting part 13b provided in the solder resist film 10 of the second bus bar 2b.

The upper edge of the first electrode plate 6 of the semiconductor package 1A is aligned with the upper edge of the vertical plane surface 2d in the first bus bar 2a, and the central part in the widthwise direction of the first electrode plate 6 is aligned with the vertical partition part 10a. Further, the upper edge of the second electrode plate 7 is aligned with the upper edge of the vertical plane surface 2d in the second bus bar 2b, and the central part in the widthwise direction of the second electrode plate 7 is aligned with the vertical partition part 10a.

In this state, the left and right side parts of each first fitting part 13a protrude from the left edge and right edge of the first and second electrode plates 6 and 7. The left side part and lower part, or the right side part and lower part of the second fitting part 13b protrude from the left edge, lower edge and right side edge of the first and second electrode plates 6 and 7.

The parts of the first fitting part 13a which protrude from the first and second electrode plates 6 and 7 have generally an "I"-like shape. The parts of the second fitting part 13b which protrude from the first and second electrode plates 6 and 7 have generally an "L"-like shape, in opposite direction with each other. Most of the vertical partition part 10a and horizontal partition part 10b are covered by the first and second electrode plates 6 and 7.

Accordingly, the first electrode plate 6 of the semiconductor package 1A is aligned with the first and second fitting parts 13a and 13b of the solder resist film 10 in the first bus bar 2a, so as to be temporarily held therebetween. Further, the second electrode plate 7 of the semiconductor package 1A is aligned with the first and second fitting parts 13a and 13b of the solder resist film 10 in the second bus bar 2b, so as to be temporarily held therebetween.

In this state, the semiconductor package 1A and the first and second bus bars 2a and 2b are contained in a heating furnace so as to be heated therein. After a predetermined period of time has elapsed, the first and second solder members 50 melt so that the main surface of the first electrode plate 6 is solder-joined with the first bus bar 2a, and the main surface of the second electrode plate 7 is solder-joined with the second bus bar 2b.

A space is formed between the left and right edges of the first and second electrode plates 6 and 7 and the left and right edges of the first fitting part 13a. A space is formed between the left and right edges and lower edges of the first electrode plate 6 and second electrode plate 7 and the left and right edges and lower edge of the second fitting part 13b.

Thus, the heated first and second solder members 50 melt so that the entire surface of the first electrode plate 6 and the first bus bar 2a are securely solder-joined, and the entire surface of the second electrode plate 7 and the second bus bar 2b are securely solder-joined, thereafter exuding into the space formed between the edges of the electrode plates 6 and 7 and the first and second fitting parts 13a and 13b.

The melted solder member 50 tends to stay a lot in the space formed between the first fitting part 13a and the second fitting part 13b protruding from the electrode plates 6 and 7, under the influence of gravity. However, even if the melted solder member 50 spreads out of the first and second fitting parts 13a and 13b, the member is prevented from spreading out or flowing out by the solder resist film 10.

That is, even if the solder member 50 melting in the first fitting part 13a flows out to the second fitting part 13b under the influence of gravity, the horizontal partition part 10b formed in the solder resist film 10 makes all of the solder member 50 stay in the range of the first fitting part 13a.

The melted solder member 50 tends to remain on the upper side and stay a lot on the lower side, under the influence of gravity. In this embodiment, the large first fitting parts 13a are arranged on the upper side, while the small second fitting parts 13b are arranged on the lower side. As a result, the part of the first fitting part 13a which protrudes from the semiconductor package 1A is larger than that of the second fitting part 13b. Therefore, the solder joint thickness of the first fitting part 13a is approximately the same as that of the second fitting part 13b.

Accordingly, the solder resist film 10 partitions the first and second fitting parts 13a and 13b with the horizontal partition part 10b, as the soldering control unit S3, thereby forming a solder pool in the area required to be soldered, resulting in an optimum solder joint thickness, and also the improved reliability of the solder joint.

Figure 6A:
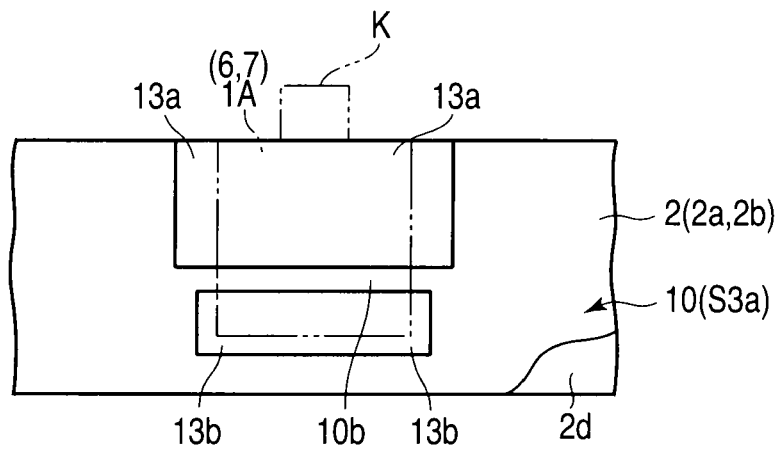
FIG. 6A is a partial front view of the bus bar, showing a modification of the third embodiment according to the soldering control unit.
Figure 6B:
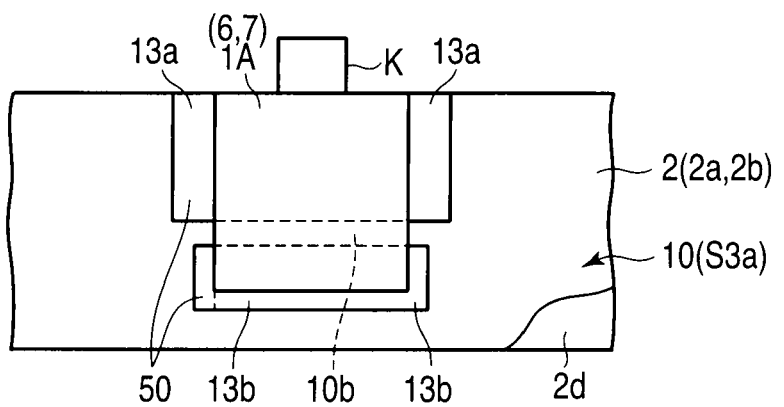
FIG. 6B is a partial front view for explaining the soldering of the bus bar to the semiconductor package, and showing a modification of the third embodiment according to the soldering control unit.

FIG. 6A is a partial front view of the bus bar 2 including the soldering control unit (soldering control means) S3a as a modification of the above-described third embodiment, and FIG. 6B is a partial front view of the state in which the semiconductor package 1A is soldered to the bus bar 2.

The difference from the above-described soldering control unit S3 of the third embodiment is that the first fitting part 13a and the second fitting part 13b (provided in the solder resist film 10 covering the first bus bar 2a and the vertical plane of the second bus bar 2b) is partitioned only by the horizontal partition part 10b, and the vertical partition part 10a is not provided therefor.

That is, the horizontal partition part 10b of the solder resist film 10 horizontally partitions the first fitting part 13a and the second fitting part 13b into two stages. The position of the first fitting part 13a is the same as the above, and has a larger size than that of the above by the vertical partition part 10a. The position of the second fitting part 13b is also the same as the above, and has a larger size than that of the above by the vertical partition part 10a. In both cases, the area and shape protruding from the semiconductor package 1A are the same as the above, thus attaining the same functional effect.

As described above, when the semiconductor package 1A is soldered to the first and second bus bars 2a and 2b through the first and second solder members 50, the sheet-like semiconductor package 1A is set up in a vertical posture. The fitting part of the first bus bar 2a to be solder-joined to the main surface of this semiconductor package 1A is formed on the vertical plane surface 2d of the bus bar. Similarly, the fitting part of the second bus bar 2b to be solder-joined onto the back surface of the semiconductor package 1A facing the main surface thereof is formed on the vertical plane surface 2d of the bus bar 2b.

Further, the protruding part K is provided on the insulating substrate 8 included in the semiconductor package 1A, and needs to protrude from the first and second bus bars 2a and 2b. In this case, for the protruding part K to protrude from the upper edges of the first and second bus bars 2a and 2b, the upper edge of the semiconductor package 1A is aligned with the upper edge of the vertical plane surface 2d of the bus bars 2a and 2b. For this purpose, a space is provided between the lower edge of the semiconductor package 1A and the lower edge of the bus bars 2a and 2b.

Because the soldered surfaces of the semiconductor package 1A and the first and second bus bars 2a and 2b all have flat vertical planes, and because there is no means for temporarily fixing the semiconductor package 1A, it is difficult to vertically align the semiconductor package 1A with the bus bars 2a and 2b, when soldering the semiconductor package 1A.

Even if one semiconductor package 1A is accurately aligned, a plurality of semiconductor packages 1A are soldered to the bus bars 2a and 2b that are long in the longitudinal direction, thus possibly causing a positional deviation of another semiconductor package 1A.

The first and second solder members intervene between the semiconductor package 1A and the bus bars 2a and 2b, and are heated so as to melt, thereby flowing out under the influence of gravity. Because the bus bars 2a and 2b are mounted on a working surface, their positions stay the same. However, the semiconductor package 1A is simply sandwiched and floats between the bus bars 2a and 2b. Thus, there is a high possibly of its changing position.

It is therefore necessary to provide means for securely supporting all of the plurality of semiconductor packages 1A so that their positions are not changed, particularly in the soldering process.

Figure 7A:
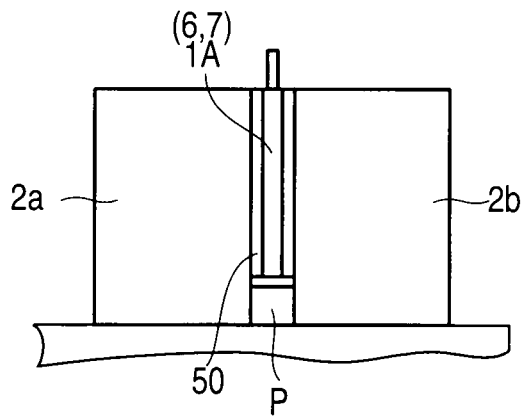
FIG. 7A is a side view for explaining the soldering of bus bars to a semiconductor package in a reference example according to a soldering control unit.

As shown in FIG. 7A, one means for supporting the semiconductor package is a spacer P having a length size corresponding to the floating length of the semiconductor package 1A. Each semiconductor package 1A is supported on this spacer P. Together with the semiconductor package 1A, the spacer is sandwiched and held between the first bus bar 2a and the second bus bar 2b.

Figure 7B:
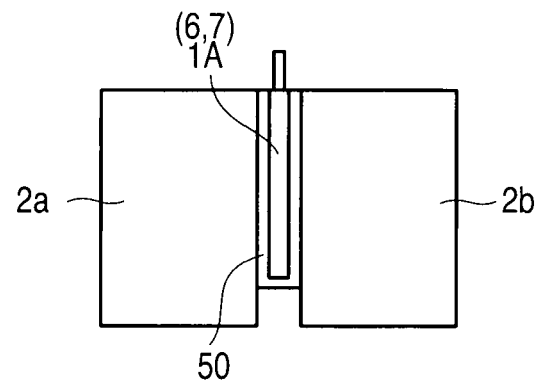
FIG. 7B is a side view for explaining the soldering of the bus bars to the semiconductor package, in the reference example according to the soldering control unit.

The spacer P is formed from synthetic resins such as glass epoxy, bakelite, Teflon (registered trademark) or polyimide, or heat resisting metal material such as stainless steel or aluminum. Any of such materials can be selected because they cannot be soldered. After the semiconductor package 1A is soldered to the bus bars 2a and 2b, the spacer P is pulled out so as to be used for the next soldering, as shown in FIG. 7B.

In this case, the semiconductor package 1A is mounted on the spacer P and intervenes between the bus bars 2a and 2b, thereby advantageously preventing the position deviation of the semiconductor package 1A even if the solder member 50 melts.

However, the spacer P is a separately provided component, and requires many processes for manufacturing and managing it. Further, the spacer P requires the same length size as that of the bus bars 2a and 2b, requires the same width size as the semiconductor package 1A, and has a very short length, thus having an extremely small size in section. Thus, it is very difficult to handle the spacer in the actual soldering processing.

In the fourth embodiment, the first bus bar 2a and the second bus bar 2b have a soldering control unit S4 for providing an optimum solder joint thickness and facilitating the positioning during the soldering of the semiconductor package 1A.

Figure 8A:
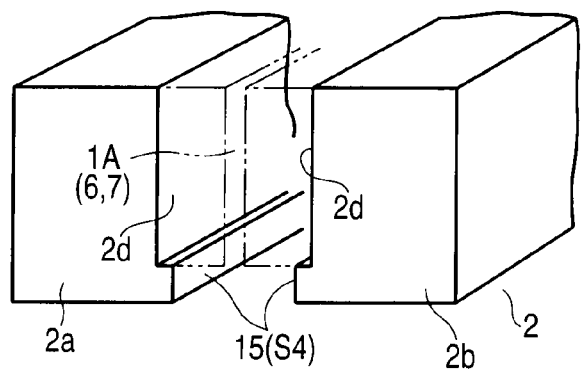
FIG. 8A is a partial perspective view of bus bars in the fourth embodiment according to a soldering control unit.
Figure 8B:
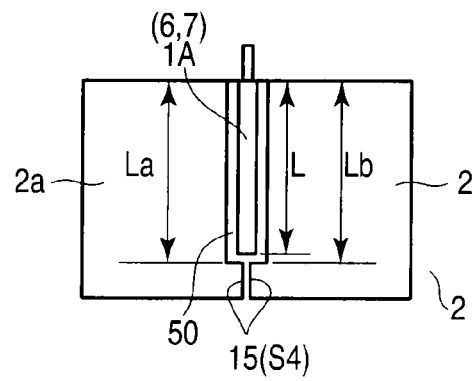
FIG. 8B is a side view for explaining the soldering of the bus bars to a semiconductor package, in the fourth embodiment according to the soldering control unit.

FIG. 8A is a partial perspective view of each of the first bus bar 2a and the second bus bar 2b having the soldering control unit (soldering control means) S4 in the fourth embodiment, and FIG. 8B is a side view of a state in which the semiconductor package 1A is soldered to the bus bars 2a and 2b.

The soldering control unit (soldering control means) S4 is provided on the end terminal of the first and second bus bars 2a and 2b. This soldering control unit S4 is a first protrusion 15 provided on the lower end of the vertical plane surface 2d in the first bas bar 2a, and is a second protrusion 15 provided on the lower end of the vertical plane surface 2d in the second bas bar 2b.

The distance La from the upper edge of the vertical plane surface 2d of the first bus bar 2a to the upper edge of the first protrusion 15 is approximately equal to a length size L from one edge in the vertical direction of the first electrode plate 6 to the other edge thereof. The distance Lb from the upper edge of the vertical plane surface 2d of the second bus bar 2b to the upper edge of the second protrusion 15 is approximately equal to a length size L from the one end in the vertical direction of the second electrode plate 7 to the other end thereof. In fact, the vertical plane surface 2d of the first bus bar 2a is entirely notched except the first protrusion 15, while the vertical plane surface 2d of the second bus bar 2b is entirely notched except the second protrusion 15.

On the upper side from the first and second protrusions 15 on the vertical plane surface 2d of the bus bars 2a and 2b, the fitting parts of the semiconductor package 1A are covered by the solder resist film 10. The fitting parts are coated by the solder member, and the semiconductor package 1A is aligned in such a manner that both of the fitting parts face each other.

As shown in FIG. 8B, when the semiconductor package 1A is soldered between the first and second bus bars 2a and 2b, the vertical plane surfaces 2d of the first and second bus bars 2a and 2b are arranged to face each other. At this time, the first and second protrusions 15 provided on the lower end of the bus bars 2a and 2b are not in contact with each other, and are arranged with a predetermined distance away from each other.

That is, if the protrusions 15 are in contact with each other with low accuracy in the flatness of the facing surfaces, the bus bars 2a and 2b are inclined toward each other, thus not maintaining their parallelism. It is necessary to attain an extremely high accuracy of flatness, thus having an effect on the process steps. Thus, the accuracy in the flatness of the facing planes of the protrusions 15 is decreased so as to prevent the effect on the processing steps and to separate the facing planes from each other.

The semiconductor package 1A is placed on the first and second protrusions 15 of the respective bus bars 2a and 2b. Specifically, the semiconductor package 1A is set up in a vertical posture, and the first electrode plate 6 is placed on the first protrusion 15 provided in the first bus bar 2a, and the second electrode plate 7 is placed on the second protrusion 15 provided in the second bus bar 2b.

The distance La from the upper edge of the vertical plane surface 2d of the first bus bar 2a to the upper edge of the first protrusion 15 is approximately equal to the length size L in the vertical direction of the first electrode plate 6. Thus, the upper edge of the bus bar 2a approximately coincides with the upper edge of the first electrode plate 6.

At the same time, the distance Lb from the upper edge of the vertical plane surface 2d of the second bus bar 2b to the upper edge of the second protrusion 15 is approximately equal to the length size L in the vertical direction of the second electrode plate 7. Thus, the position of the upper edge of the bus bar 2b approximately coincides with that of the upper edge of the second electrode plate 7.

That is, when aligning the semiconductor package 1A with the vertical plane surface 2d of each of the bus bars 2a and 2b, the semiconductor package 1A is simply put on the first and second protrusions 15, thereby facilitating the positioning of the semiconductor package 1A in the vertical direction.

After the semiconductor package 1A and the bus bar 2 are placed into the heating furnace and heated therein, the solder member 50 melts. The first electrode plate 6 is soldered to the first bus bar 2a through the first solder member 50, while the second electrode plate 7 is soldered to the second bus bar 2b through the second solder member 50. Further, the solder members 50 are prevented from spreading out by the solder resist film formed around the fitting part.

Even if a part of the melted solder member 50 flows out from the lower end of the semiconductor package 1A, its bottom dead center is set by the first and second protrusions 15. In other words, because the first and second protrusions 15 are provided, a solder pool is formed on their upper section, thereby preventing the solder member 50 from flowing out from each protrusion 15 to the lower end surface of the bus bars 2a and 2b.

Accordingly, the first protrusion 15 is provided on the lower end of the first bus bar 2a, as the soldering control unit S4, while the second protrusion 15 is provided on the lower end of the second bus bar 2b. As a result, the positioning of the semiconductor package 1A in the vertical direction can be facilitated, by simply placing the semiconductor package 1A on the first and second protrusions 15.

The solder pool can securely be formed in an area required to be soldered on the protrusions 15 being set as a bottom dead center, thereby providing an optimum solder joint thickness and attaining improved reliability of the soldering.

Figure 9A:
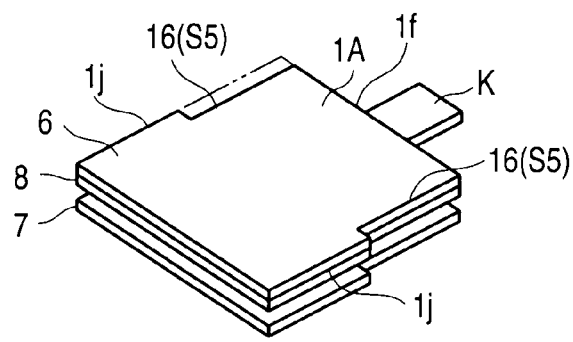
FIG. 9A is a perspective view of a semiconductor package in the fifth embodiment according to a soldering control unit.
Figure 9B:
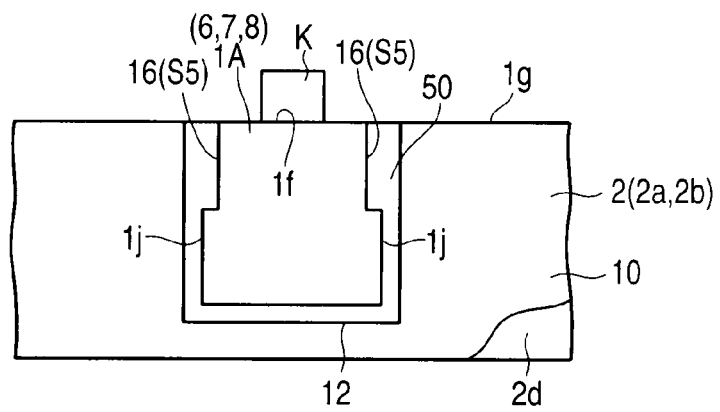
FIG. 9B is a partial front view for explaining the soldering of a bus bar to the semiconductor package, in the fifth embodiment according to the soldering control unit.

FIG. 9A is a perspective view of the semiconductor package 1A, for explaining the fifth embodiment, and FIG. 9B is a partial front view of the semiconductor package 1A soldered to the bus bar 2. In this embodiment, the semiconductor package 1A includes a soldering control unit (soldering control means) S5.

As described above, the insulating substrate 8 included in the semiconductor package 1A includes a protruding part K protruding outward from an outer edge 1f of the first electrode plate 6 and the second electrode plate 7. This protruding part K includes an external connection terminal for connecting to the control electrode of the power semiconductor element 5.

The first electrode plate 6, the second electrode plate 7 and the insulating substrate 8 included in the semiconductor package 1A are formed in a rectangular shape in a planar perspective, and include a processing edge part 1j which is formed in a direction opposite to the projection direction of the protruding part K and provided at the outer edge 1f aligned with an upper edge 1g of each of the first bus bar 2a and the second bus bar 2b.

The soldering control unit S5 is a notch part 16 provided over a predetermined distance from the outer edge 1f of the processing edge part 1j. Specifically, the first and second electrode plates 6 and 7 and the insulating substrate 8 include the notch parts 16 on left and right edge parts (i.e. processing edge part) 1j in the state where the semiconductor package 1A is soldered to the bus bar 2. The notch part 16 having a width size of approximately 0.5 to 1 mm is provided in parallel with the end edge of the edge part 1j over approximately half the distance along each of the edge part 1j from the upper edge 1f.

As shown in FIG. 9B, the vertical plane surfaces 2d of the first bus bar 2a and the second bus bar 2d are covered by the solder resist film 10 for forming the fitting part 12 having a larger size than the external size of the semiconductor package 1A, and the fitting part 12 is coated by the solder member 50.

The semiconductor package 1A is positioned with respect to the fitting part 12, and is contained in the heating furnace so as to be heated therein. The solder member 50 melts. Then, the first electrode plate 6 and the first bus bar 2a are solder-joined through the first solder member 50, and the second electrode plate 7 and the second bus bar 2b are solder-joined through the second solder member 50. At this time, the solder resist film 10 around the fitting part 12 prevents each solder member 50 from spreading out or flowing out of the fitting part 12.

A plurality of notch parts 16 are provided in both processing edge parts 1j of the first electrode plate 6, second electrode plate 7 and insulating substrate 8 of the semiconductor package 1A. The melted solder member 50 remains at the notch parts 16. Further, each of the notch parts 16 is provided in the upper half of the semiconductor package 1A. Thus, the solder member 50 stays more on the upper side than on the lower side in the processing edge parts 1j.

The space between the notch part 16 and the solder resist film 10 as the side edge of the fitting part 12 is larger than the space between the side edge of the processing edge part 1j excluding the notch part 16 and the solder resist film 10. As a result, the solder member 50 remains in the larger space.

As described above, the melted solder member 50 is thinner on the upper side than on the lower side, under the influence of gravity. Therefore, in this embodiment, the notch part 16 is provided in the upper half of the semiconductor package 1A, and the space with respect to the solder resist film 10 is larger than the space of the lower half. The notch part 16 will be a solder pool (fillet) for keeping the melted solder member 50 as much as possible, thus providing an optimum joint thickness of the solder member 50 and attaining improved reliability of the soldering.

Figure 10A:
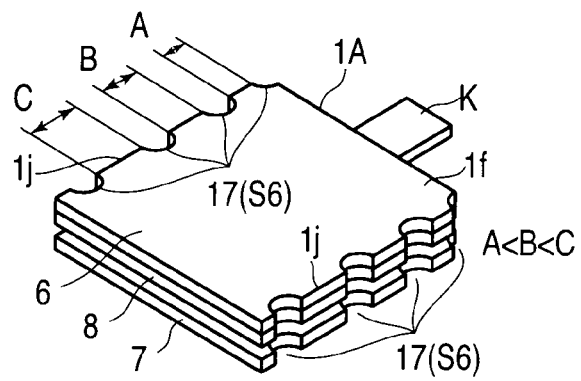
FIG. 10A is a perspective view of a semiconductor package in the sixth embodiment according to a soldering control unit.
Figure 10B:
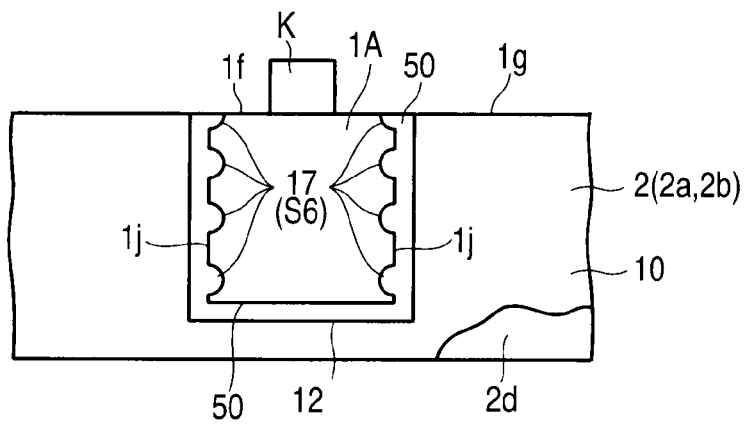
FIG. 10B is a partial front view for explaining the soldering of a bus bar and the semiconductor package in the sixth embodiment according to the soldering control unit.

FIG. 10A is a perspective view of the semiconductor package 1A, for explaining the sixth embodiment, and FIG. 10B is a partial front view showing the semiconductor package 1A which is soldered to the bus bar 2. In this embodiment, the semiconductor package 1A includes a soldering control unit (soldering control means) S6.

As shown in FIG. 10A, the insulating substrate 8 included in the semiconductor package 1A includes a protruding part K which protrudes outward from the outer edge 1f of the first electrode plate 6 and second electrode plate 7. The first electrode plate 6, the second electrode plate 7 and the insulating substrate 8 are formed in a rectangular shape in a planar perspective, and include the processing edge parts 1j formed in a direction opposite to the projection direction of the protruding part K and provided at the outer edge 1f which is aligned with an upper edge 1g of the first and second bus bars 2a and 2b.

Further, a plurality of notch parts 17 having a semicircle form or one-quarter circle are provided in the both processing edges part 1j of the first and second electrode plates 6 and 7 and the insulating substrate 8 included in the semiconductor package 1A. The plurality of notch parts 17 form the soldering control unit S6.

A set of four notch parts 17 are provided in each processing edge part 1j. The notch parts 17 have the same radius. Thus, the semicircle notch parts 17 all have the same notch size.

The lower the section of the semiconductor package 1A from the outer edge 1f, the wider the space between the notch parts 17. In FIG. 10A, "A" denotes the space between the notch part 17 at the uppermost layer (the first layer) and the notch part 17 at the second layer, "B" denotes the space between the notch part 17 at the second layer and the notch part 17 at the third layer, "C" denotes the space between the notch part 17 at the third layer and the notch part 17 at the lowermost layer (the fourth layer). In this case, the condition of A<B<C can be set.

As shown in FIG. 10B, the vertical plane surface 2d of the bus bar 2 is covered by the solder resist film 10 for forming the fitting part 12 having a larger size than that of the semiconductor package 1A, and the fitting part 12 is coated by the solder member 50.

The semiconductor package 1A is aligned with the fitting part 12, and contained in the heating furnace so as to be heated. The solder member 50 melts. Then, the first electrode plate 6 is solder-joined with the first bus bar 2a through the first solder member 50, while the second electrode plate 7 is solder-joined with the second bus bar 2b through the second solder member 50. At this time, the solder resist film 10 around the fitting part 12 prevents the solder member 50 from spreading out or flowing out.

Because the plurality of notch parts 17 are provided along the both processing edge parts 1j of the semiconductor package 1A, the notch parts 17 will be solder pools in which the melted solder member 50 remains. The lower the section of the processing edge part 1j from the outer edge side 1f, the wider the space between the notch parts 17. Thus, the melted solder member 50 remains in the notch part 17 on the upper side, and the solder member 50 slightly remains in the notch part 17 on the lower side.

As described above, the melted solder member 50 is thinner on the upper side than on the lower side under the influence of gravity. In this embodiment, therefore, the lower the section of the processing edge part 1j, the wider the space between the notch parts 17 formed to have the same notch size. This results in accumulating the melted solder member 50 a lot on the upper side, and providing an optimum joint thickness of the solder member 50 and attaining improved reliability of the soldering.

Figure 11A:
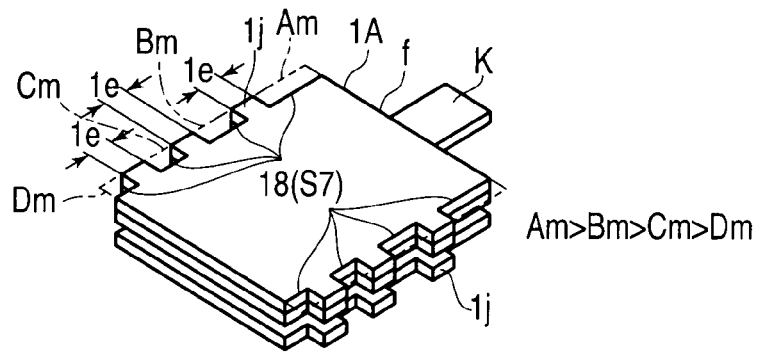
FIG. 11A is a perspective view of a semiconductor package in the seventh embodiment according to a soldering control unit.
Figure 11B:
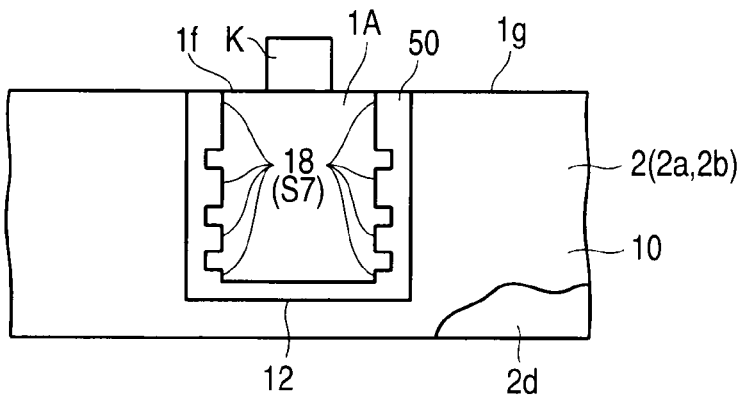
FIG. 11B is a partial front view for explaining the soldering of a bus bar to the semiconductor package, in the seventh embodiment according to the soldering control unit.

FIG. 11A is a perspective view of the semiconductor package 1A, for explaining the seventh embodiment, and FIG. 11B is a partial front view of the semiconductor package 1A soldered to the bus bar 2. In this embodiment, the semiconductor package 1A includes a soldering control unit (soldering control means) S7.

As shown in FIG. 11A, the insulating substrate 8 included in the semiconductor package 1A includes a protruding part K which protrudes outward from the outer edge 1f of the first electrode plate 6 and the second electrode plate 7. The first electrode plate 6, the second electrode plate 7 and the insulating substrate 8 are formed in a rectangular shape in a planar view, and include the processing edge parts 1j which are formed in a direction opposite to the projection direction of the protruding part K and provided at the outer edge 1f aligned with an upper edge 1g of each of the first bus bar 2a and the second bus bar 2b.

Further, a plurality of notch parts 18 are provided in both the processing edge parts 1j of the first and second electrode plates 6 and 7 and the insulating substrate 8 of the semiconductor package 1A. The plurality of notch parts 18 form the soldering control unit S7.

In this case, a set of four notch parts 18 are provided in each processing edge part 1j. Spaces 1e of the notch parts 18 are formed in the same shape, and the notch parts 18 have the same width size and different length sizes thus having different notch sizes.

Specifically, the lower the section of the semiconductor package 1A from the outer edge 1f, the smaller the notch size of the notch parts 18. That is, "Am" denotes the notch size of the notch part 18 at the uppermost layer (the first layer), "Bm" denotes the notch size of the notch part 18 at the second layer, "Cm" denotes the notch size of the notch part 18 at the third layer, and "Dm" denotes the notch size of the notch part 18 at the lowermost layer (the fourth layer). In this case, the condition of Am>Bm>Cm>Dm is set.

As shown in FIG. 11B, the vertical plane surfaces 2d of the first bus bar 2a and the second bus bar 2b are covered by the solder resist film 10 for forming the fitting part 12 having a larger size than that of the semiconductor package 1A, and the fitting part 12 is coated by the solder member 50.

The semiconductor package 1A is aligned with the fitting part 12, and is contained in the heating furnace so as to be heated therein. The solder member 50 melts. Then, the first electrode plate 6 is solder-joined with the first bus bar 2a through the first solder member 50. In addition, the second electrode plate 7 is solder-joined with the second bus bar 2b through the second solder member 50. At this time, the solder resist film 10 around the fitting part 12 prevents the solder member 50 from spreading out or flowing out.

Because the plurality of notch parts 18 are provided in the both processing edge parts 1j of the first electrode plates 6 and 7 and the insulating substrate 8 of the semiconductor package 1A, the notch parts 18 will be solder pools in which the melted solder member 50 remains. The lower the section of the processing edge part 1j from the outer edge side 1f, the smaller the notch size of the notch parts 18. Thus, the melted solder member 50 remains in the notch part 18 on the upper side, and the solder member 50 slightly remains in the notch part 18 on the lower side.

As described above, the melted solder member 50 is thinner on the upper side than on the lower side under the influence of gravity. In this embodiment, the lower the section of the processing edge part 1j from the upper side, the narrower the notch size of the notch parts 18, thus accumulating the melted solder member 50 a lot on the upper side, attaining an optimum joint thickness of the solder member 50 and improved reliability of the soldering.

FIG. 12A is a perspective view of the semiconductor package 1A, for explaining the eighth embodiment, and FIG. 12B is a side view showing the soldered semiconductor package 1A. In this embodiment, the semiconductor package 1A includes a soldering control unit (soldering control means) S8.

As shown in FIG. 12A, a plurality of small projections 19 having the same length are provided all over the main surface of the second electrode plate 7 included in the semiconductor package 1A. These small projections 19 form the soldering control unit S8. FIG. 12A shows only a part of the small projections 19.

To be more specific, the first electrode plate 6 and the second electrode plate 7 are formed of a metal material such as a copper material, thus enabling to perform what is called a knurling process. Thus, the surface of the second electrode plate 7 is knurled, thereby forming a plurality of spherical small projections 19 whose projection is approximately 0.05 to 0.1 mm (the illustration magnifies the small projections 19).

As shown in FIG. 12B, to solder the semiconductor package 1A with the bus bar 2, the first electrode plate 6 is in contact with the first bus bar 2a, and the second electrode plate 7 is in contact with the second bus bar 2b. In this state, the top of each of the spherical small projections 19 provided on the main surface of the second electrode plate 7 is in contact with the vertical plane of the second bus bar 2b. Thus, the concave parts having the same projection of the spherical small projections 19 are formed among the spherical small projections 19.

The vertical plane surface 2d of each of the bus bars 2a and 2b is covered by the solder resist film forming the fitting part having a larger size than the main surface of the semiconductor package 1A, and the fitting part is coated with the solder member. The fitting part is aligned with the semiconductor package 1A, and is contained in the heating furnace so as to be heated therein.

The solder member 50 melts. Then, the first electrode plate 6 is soldered-joined with the first bus bar 2a through the first solder member 50, and the second electrode plate 7 is soldered-joined with the second bus bar 2b through the second solder member 50. At this time, the solder resist film 10 around the fitting part 12 prevents each of the solder members 50 from spreading out or flowing out.

The plurality of spherical small projections 19 are provided on the main surface of the second electrode plate 7 of the semiconductor package 1A, thus forming solder pools, among the spherical small projections 19, in which the solder member 50 stays in the concave parts. As described above, the melted solder member 50 is thinner on the upper side than on the lower side, under the influence of gravity.

In this embodiment, the plurality of spherical small projections 19 are provided on the main surface of the second electrode plate 7 of the semiconductor package 1A. As a result, the melted solder member 50 can stay in the concave parts among the spherical small projections 19, thus providing an optimum joint thickness of the solder member 50 and attaining improved reliability of the soldering.

Note, in the above embodiment, the small projections 19 are formed in a spherical shape. However, the shape of the small projections 19 is not limited to this. In place of the small projections 19, the surface may be formed in a dimple pattern, or may be a concaved surface in a compound-eye lens pattern. The thing is that the solder pool simply needs to be formed between the main surface of the semiconductor package 1A and the bus bar 2. The small projections 19 have been formed on the second electrode plate 7, but may be formed on the first electrode plate 6 instead, or may be formed both on the first electrode plate 6 and the second electrode plate 7.

Figure 13A:
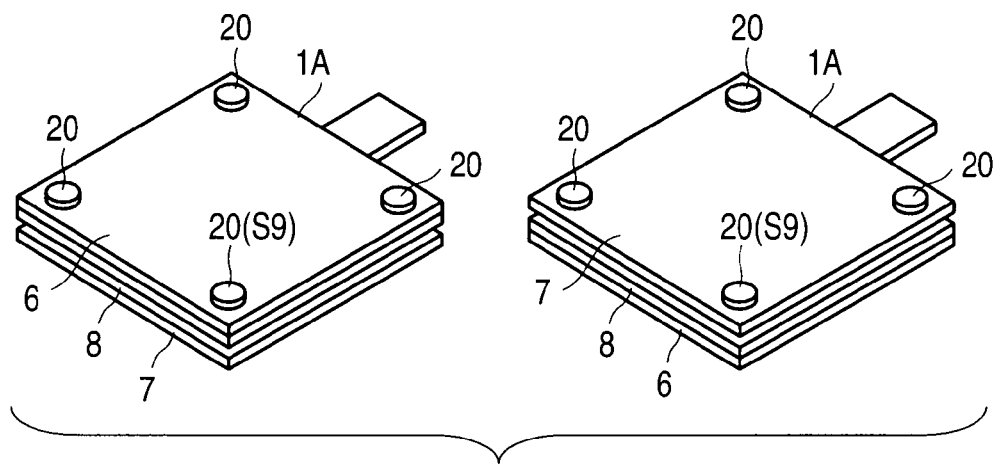
FIG. 13A is a perspective view of a semiconductor package, in the ninth embodiment according to the soldering control unit.
Figure 13B:
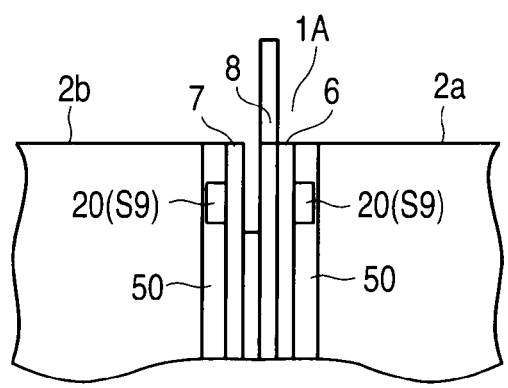
FIG. 13B is a side view for explaining the soldering of bus bars to the semiconductor package in an enlarged scale, in the ninth embodiment according to the soldering control unit.

FIG. 13A is a perspective view of the main and back surfaces of the semiconductor package 1A, for explaining the ninth embodiment, and FIG. 13B is a partially enlarged view showing the semiconductor package 1A which is soldered to the bus bar 2. In this embodiment, the semiconductor package 1A includes a soldering control unit (soldering control means) S9.

As shown in FIG. 13A, spacer convexes 20 are provided on the four corners of the main surface of each of the first electrode plate 6 and the second electrode plate 7 of the semiconductor package 1A. The spacer convexes 20 form the soldering control unit S9.

To be more specific, the spacer convexes 20 are formed in a circle with a diameter of 0.5 to 1 mm (but not limited to this size), and their projection is in a range of 0.03 to 0.5 mm, which is approximately equal to the thickness of the solder joint between the semiconductor package 1A and the bus bar 2.

As shown in FIG. 13B, when the semiconductor package 1A is solder-joined with the bus bar 2, the semiconductor package 1A is sandwiched and held between the first bus bar 2a and the second bus bar 2b. That is, the vertical plane of each of the bus bars 2 is covered by the solder resist film for forming the fitting part having a larger size than the semiconductor package 1A, and the fitting part is coated with the solder member 50. The semiconductor package 1A is aligned with the fitting part, and is sandwiched and held between the bus bars 2 and 2b so as to be contained in the heating furnace.

The solder member 50 melts. Then, the first electrode plate 6 is solder-joined with the first bus bar 2a through the first solder member 50, and the second electrode plate 7 is solder-joined with the second bus bar 2b through the second solder member 50. At this time, the solder resist film 10 around the fitting part 12 prevents each of the solder members 50 from spreading out or flowing out.

When the semiconductor package 1A is soldered to the bus bar 2, the semiconductor package 1A is aligned with the bus bars 2 so as to be sandwiched and held therebetween. At this time, a predetermined level of pressure that does not cause the positional deviation of the semiconductor package 1A is required for this alignment.

However, if this pressure is too high, the melted solder member 50 hardly intervenes between the bus bars 2 and the semiconductor package 1A, and thus a required solder joint thickness may not possibly be attained. On the other hand, if the pressure level is too low, the solder joint thickness is too thick, the solder thickness cannot evenly be attained over the entire surface.

Therefore, in this embodiment, because the spacer convexes 20 are provided on the both surfaces of the semiconductor package 1A, they are in contact with the first bus bar 2a and the second bus bars 2b. A high level of pressure is applied from the bus bars 2 to the semiconductor package 1A so that the semiconductor package 1A is firmly sandwiched and held therebetween, after which the solder member 50 melts.

Even if a high level of pressure is applied from the bus bars 2 to the semiconductor package 1A, the spacer convexes 20 intervene between the semiconductor package 1A and the bus bars 2, thereby attaining the projection. The melted solder member 50 smoothly and securely fills the spaces to be formed with the spacer convexes 20, thus attaining an optimum joint thickness of the solder member 50 and attaining improved reliability of the soldering.

Figure 14:
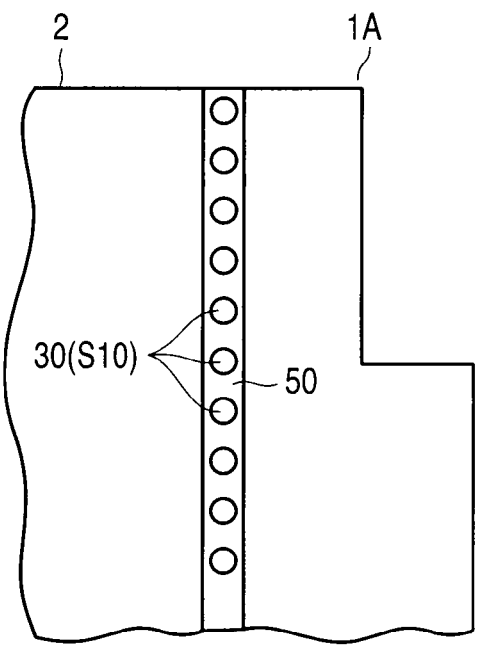
FIG. 14 is a side view for explaining the soldering of a bus bar to a semiconductor package in an enlarged scale, in the tenth embodiment according to the soldering control unit.

FIG. 14 is a partially enlarged view of the semiconductor package 1A soldered to the bus bar 2, for explaining the tenth embodiment. In this embodiment, the solder member 50 for soldering the semiconductor package 1A and the bus bar 2 includes a soldering control unit S10.

That is, the soldering control unit S10 includes a number of powdered spacer balls (metal balls) 30 mixed in the solder member 50. FIG. 14 magnifies the spacer balls 30. Each of the spacer balls 30 has a diameter of approximately 0.03 to 0.5 mm, and includes nickel, copper or nickel-plated aluminum. In any case, the spacer balls 30 are formed of a metal material that does not become a solid body so as to be stuck to the solder member 50. That is, the spacer balls 30 are formed of a metal material having a melting point higher than that of the solder member 50 and the heating temperature of the heating furnace.

The solder member 50 is rolled into a sheet-like form, so that the spacer balls 30 are arranged approximately at an equal interval. This solder sheet is cut in accordance with the shape and size of the fitting part of the solder resist film covering the vertical plane of the bus bar 2, and is sandwiched and held between the semiconductor package 1A and the bus bar 2. At this time, the piling pressure level may be so high as not to cause the positional deviation of the semiconductor package 1A.

In this state, if the semiconductor package is contained in the heating furnace so as to be heated therein, the solder member 50 melts. Then, the first electrode plate 6 is solder-joined to the first bus bar 2a through the first solder member 50, and the second electrode plate 7 is solder-joined to the second bus bar 2b through the solder member 50. At this time, the solder resist film 10 around the fitting part 12 prevents each solder member 50 from spreading out or flowing out. The spacer balls 30 mixed in the solder member 50 are sandwiched and held between the semiconductor package 1A and the bus bar 2 so as to ensure the spaces therebetween. That is, due to the existence of the spacer balls 30, a required solder joint thickness between the semiconductor package 1A and the bus bar 2 can be attained.

Accordingly, because a number of powdered spacer balls (metal balls) 30 are mixed into the solder member 50 as the soldering control unit S9, when the semiconductor package 1A is soldered to the bus bar 2, an optimum solder joint thickness and improved reliability of the soldering are attained.

The present invention is not limited to the above-described embodiments as they are, and the constituent elements thereof can be modified and embodied in the steps without departing from the principles of the present invention. Further, various inventions can be formed using an appropriate combination of the plurality of constituent elements disclosed in the above-described embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power semiconductor module comprising:
    a semiconductor device which includes:
        a power semiconductor element;
        a first electrode plate provided on one surface of the power semiconductor element;
        a second electrode plate provided on the other surface of the power semiconductor element; and
        an insulating substrate provided between the power semiconductor element and the first electrode plate;
    a first bus bar which is a conductive member soldered to a main surface of the first electrode plate included in the semiconductor device, through a first solder member;
    a second bus bar which is a conductive member soldered to a main surface of the second electrode plate included in the semiconductor device, through a second solder member; and
    soldering control elements which are provided on each of a main surface of the first bus bar to which the first electrode plate is soldered and a main surface of the second bus bar to which the second electrode plate is soldered, and which control a solder joint thickness of each of the first solder member and the second solder member;
    the soldering control elements comprising a first protrusion part provided on one end terminal of the main surface of the first bus bar to which the first electrode plate is soldered and on which one end of the first electrode plate is placed,
    a length from an edge of the main surface to the first protrusion part is the same as a length from one edge of the first electrode plate to the other edge thereof,
    the soldering control elements comprising a second protrusion part provided on one end terminal of the main surface of the second bus bar to which the second electrode plate is soldered and on which one end of the second electrode plate is placed, and
    a length from an edge of the main surface to the second protrusion part is the same as a length from one edge of the second electrode plate to the other edge thereof.

2. The power semiconductor module according to claim 1, wherein:
    the first protrusion part comprises a solder resist film which covers the main surface of the first bus bar to which the first electrode plate is soldered, and which is provided for forming a fitting part having the same size as a size of the main surface of the first electrode plate in a position to which the first electrode plate is soldered; and
    the second protrusion part comprises a solder resist film which covers the main surface of the second bus bar to which the second electrode plate is soldered, and which is provided for forming a fitting part having the same size as a size of the main surface of the second electrode plate in a position to which the second electrode plate is soldered.

3. The power semiconductor module according to claim 1, wherein:
    the first protrusion part comprises a solder resist film which covers the main surface of the first bus bar to which the first electrode plate is soldered, and which is provided for forming a fitting part having a size larger than a size of the main surface of the first electrode plate in a position to which the first electrode plate is soldered; and
    the second protrusion part comprises a solder resist film which covers the main surface of the second bus bar to which the second electrode plate is soldered, and which is provided for forming a fitting part having a size larger than a size of the main surface of the second electrode plate in a position to which the second electrode plate is soldered.

4. The power semiconductor module according to claim 1, wherein:
    the first protrusion part comprises a solder resist film which covers the main surface of the first bus bar to which the first electrode plate is soldered, and which has a partition area for partitioning a fitting area having a size larger than a size of the main surface of the first electrode plate so that the fitting area is partitioned into a plurality of areas, in a position to which the first electrode plate is soldered; and
    the second protrusion part comprises a solder resist film which covers the main surface of the second bus bar to which the second electrode plate is soldered, and which has a partition area for partitioning a fitting area having a size larger than a size of the main surface of the second electrode plate so that the fitting area is partitioned into a plurality of areas, in a position to which the second electrode plate is soldered.

5. A power semiconductor module comprising:
    a semiconductor device which includes:
        a power semiconductor element;
        a first electrode plate provided on one surface of the power semiconductor element;
        a second electrode plate provided on the other surface of the power semiconductor element; and
        an insulating substrate provided between the power semiconductor element and the first electrode plate;
    a first bus bar which is a conductive member soldered to a main surface of the first electrode plate included in the semiconductor device, through a first solder member;
    a second bus bar which is a conductive member soldered to a main surface of the second electrode plate included in the semiconductor device, through a second solder member; and
    soldering control elements which are provided on each of a main surface of the first bus bar to which the first electrode plate is soldered and a main surface of the second bus bar to which the second electrode plate is soldered, and which controls a solder joint thickness of each of the first solder member and the second solder member, wherein the soldering control elements comprise,
a first protrusion part provided on one end terminal of the main surface of the first bus bar to which the first electrode plate is soldered and on which one end of the first electrode plate is placed, and a second protrusion part provided on one end terminal of the main surface of the second bus bar to which the second electrode plate is soldered and on which one end of the second electrode plate is placed.

* * * * *